(12) United States Patent
Ang et al.

(10) Patent No.: US 6,441,357 B2
(45) Date of Patent: Aug. 27, 2002

(54) USING CASCADED GAIN STAGES FOR HIGH-GAIN AND HIGH-SPEED READOUT OF PIXEL SENSOR DATA

(75) Inventors: Lin Ping Ang; Sandor L. Barna, both of Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/847,894

(22) Filed: May 2, 2001

Related U.S. Application Data

(63) Continuation of application No. 09/357,605, filed on Jul. 20, 1999, now Pat. No. 6,229,134.
(60) Provisional application No. 60/104,174, filed on Oct. 13, 1998.

(51) Int. Cl.[7] .............................................. H01L 27/14
(52) U.S. Cl. .................................... 250/208.1; 348/300
(58) Field of Search ......................... 250/208.1, 214 R, 250/214 A, 214 LA; 348/294, 300, 301, 303, 298, 295, 308, 317; 327/514, 515

(56) References Cited

U.S. PATENT DOCUMENTS

| | | | | |
|---|---|---|---|---|
| 5,600,127 A | * | 2/1997 | Kimata | ........................ 348/300 |
| 5,608,204 A | * | 3/1997 | Hofflinger et al. | ........ 250/208.1 |
| 5,665,959 A | * | 9/1997 | Fossum et al. | ........... 250/208.1 |
| 5,701,101 A | * | 12/1997 | Weinhardt et al. | ........... 327/561 |
| 5,841,126 A | | 11/1998 | Fossum et al. | |

* cited by examiner

Primary Examiner—Kevin Pyo
(74) Attorney, Agent, or Firm—Fish & Richardson P.C.

(57) ABSTRACT

A sampling and readout system including a cascaded stage charge amplifier samples, amplifies, and outputs pixel sensor data from an array of pixel sensors. The charge amplifier divides the gain into several gain stages. Each gain stage amplifies the pixel sensor data.

4 Claims, 7 Drawing Sheets

USING CASCADED GAIN STAGES FOR HIGH-GAIN AND HIGH-SPEED READOUT OF PIXEL SENSOR DATA

CROSS-REFERENCE TO RELATED APPLICATIONS

This application is a continuation of the priority of U.S. patent application Ser. No. 09/357,605, filed Jul. 20, 1999, now U.S. Pat. No. 6,229,134 and entitled "Using Cascaded Gain Stages for High-Gain and High-Speed Readout of Pixel Sensor Data" claims benefit of provisional appln. 60/104,174 filed Oct. 13, 1998.

BACKGROUND

The present specification generally relates to high-gain amplifiers and particularly to pixel sensor readout amplifiers.

Image sensors, such as active pixel sensors described in U.S. Pat. No. 5,841,126, require that the number of photons that are received be accurately counted. Accurate counting often requires small level signals to be amplified. The amplifiers in certain cases are charge amplifiers.

A charge amplifier can be conceptually thought of as an operational amplifier "op-amp" with capacitors at the input and the feedback between the output and the input. The gain is proportional to the ratio of the values of these capacitors. However, making a larger capacitor requires more area on the substrate. Therefore, a high gain device requires a very large gain area. Each double in gain requires a double in area on the substrate. It also requires a more complicated op-amp, since it requires the op-amp output to drive a larger capacitor. In addition, a single-stage high-speed application requires high power consumption.

SUMMARY

The techniques described herein address this problem using two special cascaded stages. The stages are arranged to have a multiplying effect on the resultant signal.

For example, in one embodiment, a 256X gain amplifier can be cascaded into two 16X gain amplifiers. Each of the 16X gain amplifiers requires 1/16 the area on the chip as the 256X gain amplifier. Therefore, two of the 16X gain stages require only 1/8 or 12.5% of the area.

In one aspect, the present specification involves sampling and readout of pixel data. The sampling and readout is performed by a pixel sensor readout system. The system includes a sampling circuitry, a charge amplifier, and a readout circuitry.

The sampling circuitry sequentially samples pixel sensor data from an array of pixel sensors. The pixel sensor data represents photons integrated as electrons and collected by the pixel sensors. The charge amplifier has a cascade of gain stages. Each gain stage amplifies the pixel sensor data sampled by the sampling circuitry. The readout circuitry sequentially outputs an analog voltage corresponding to each of the amplified pixel sensor data.

Each gain stage of the charge amplifier includes an op-amp, a feedback capacitor, and an input capacitor.

The op-amp is configured to amplify a difference voltage present at a negative input of the op-amp with respect to some reference voltage at a positive input of the op-amp, and to drive the output according to the amplified difference voltage. The gain of the op-amp is determined by the ratio of the value of the feedback capacitor and the input capacitor.

In another aspect, an active pixel sensor (APS) system having an output port is disclosed. The APS system includes a pixel sensor array, a row-select element, a sampling and readout circuitry and an analog-to-digital converter (ADC) circuit.

The pixel sensor array forms an electrical representation of an image being sensed. The row-select element selects a row of pixel sensors. The sampling and readout circuitry sequentially samples sensor data from the pixel sensor array, and outputs an analog voltage corresponding to each of the pixel sensor data. The analog-to-digital converter circuit converts analog voltage outputted by the sampling and readout circuitry to digital pixel data, and transfers the digital pixel data to the output port.

In some embodiments, the APS system further includes a timing and control unit to generate signals that select appropriate pixel data for sampling and transferring the data to the output port.

In another aspect, an APS camera system for converting an array of pixel data to a visual image is disclosed. The camera system includes all the elements in the APS system and an image display device. The display device arranges the pixel data from the output port in sequential order of rows to display the visual image on the display screen.

The details of one or more embodiments are set forth in the accompanying drawings and the description below. Other embodiments and advantages will become apparent from the following description and drawings, and from the claims.

BRIEF DESCRIPTION OF THE DRAWINGS

These and other aspects will be described in reference to the accompanying drawings wherein.

Like reference numbers and designations in the various drawings indicate like elements.

DETAILED DESCRIPTION

Figure 1:
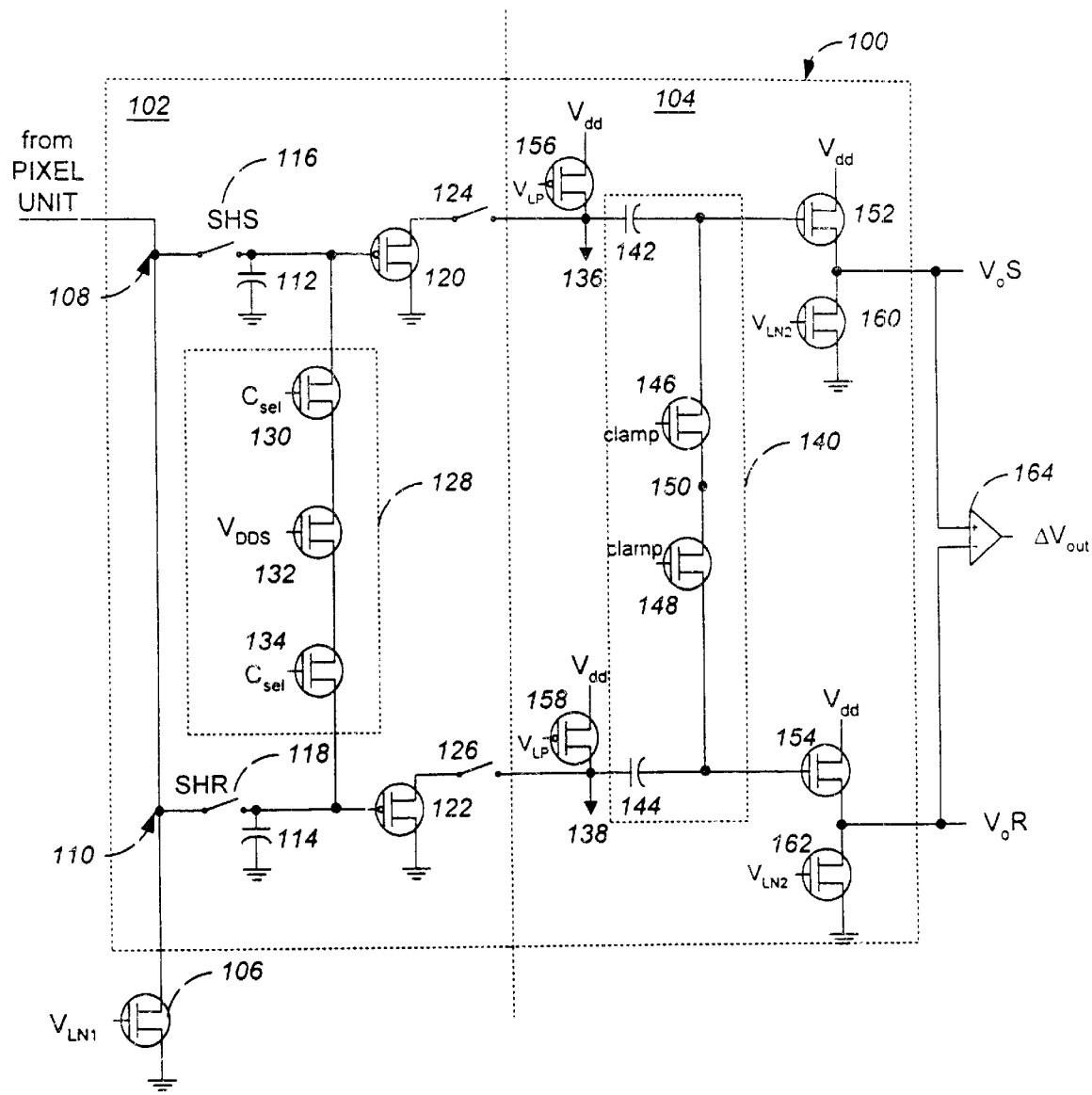
FIG. 1 is one embodiment of signal chain electronics in an image sensor.

A conventional active pixel sensor (APS) includes an on-chip timing and control circuit, and a sampling and readout circuitry. FIG. 1 illustrates one embodiment of the sampling and readout circuitry 100 of the conventional APS. The sampling and readout circuitry 100 include a pixel unit, a sampling circuitry 102, and a readout circuitry 104.

The pixel unit includes a photodiode that stores incident photons using a photoreceptors, e.g. a photodiode or a photogate. If the photogate is used, the photons are integrated as electrons within the photogate well. The output of the pixel unit is buffered by a source-follower transistor and a reset transistor. In an APS array, a particular row is selected by a row selection transistor. This allows the information from within the selected pixel to be passed to the sampling circuitry 102.

The sampling circuitry 102 is located at the bottom of each column of pixels. The sampling circuitry 102 includes a load transistor 106 and two output branches 108, 110. The output branches 108, 110 store the reset and signal levels, respectively. Each branch 108 or 110 includes a holding capacitor 112 or 114 and a sampling switch 116 or 118. Each branch also includes a source-follower transistor 120 or 122 and a column-selection switch 124 or 126.

The column readout cycle begins when a row is selected by the row selection transistor in the pixel. First a reset value for correlated double sampling is obtained by sampling the reset value onto the reset holding capacitor 114. This is done by activating the reset sampling (SHR) switch 118 during the time of reset. Reset is removed, and sampling is initiated by activating the signal sampling (SHS) switch 116 to place the signal from each column pixel in the selected row onto the signal holding capacitor 112.

After the current pixel value has been transferred to the holding capacitor 112, the pixel in the selected row is reset by biasing reset transistor to a low level.

The reset and signal levels are read out differentially, allowing correlated double sampling to suppress 1/f noise and fixed pattern noise (FPN) from the pixel. The reset and signal outputs are placed on the output data bus by the column-selection switches 124, 126.

A double delta sampling (DDS) circuit 128 shorts the sampled signals during the readout cycle, thereby reducing column FPN.

Sequential readout of each column is as follows. First, a column is selected by the column-selection switches 124, 126. After a settling time equivalent to one-half the column selection period, the DDS is performed to remove column FPN. In this operation, a DDS transistor 132 and two column-selection transistors 130, 134 on either side are used to short together the two holding capacitors 112, 114.

Prior to the DDS operation, the reset and signal outputs 136, 138 contain their respective signal values plus a source-follower 120 or 122 voltage threshold component.

A threshold removing circuit 140 is used to remove the threshold voltage of the source-followers 120, 122 during the DDS operation. Initially, the charge capacitors 142, 144 are pre-charged to a clamp voltage at node 150 through clamp transistors 146, 148. Immediately after the clamp is released, the DDS transistors 130, 132, 134 are turned on. When the transistors 130, 132, 134 are shorted, the voltage that is applied to the output drivers 152, 154 includes a voltage that is free of the voltage threshold component. The difference output voltage is obtained by a difference amplifier 164.

The PMOS transistors 156, 158 act as load transistors for the PMOS source-follower transistors 120, 122. The NMOS transistors 160, 162 act as load transistors for the output drivers 152, 154.

The sampling circuitry 102 is common to an entire column of pixels. The readout circuitry 104 is common to the entire APS array.

Figure 2:
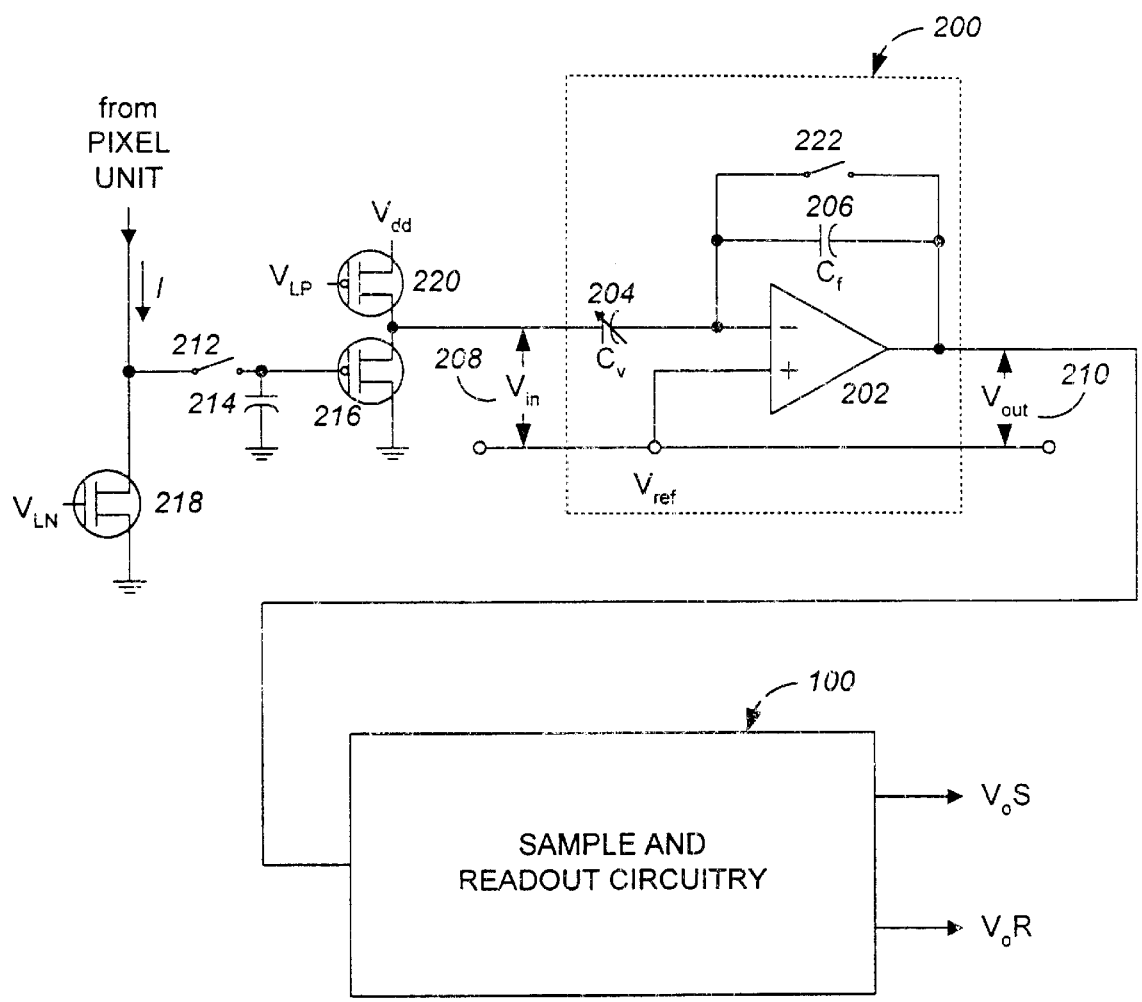
FIG. 2 is a conventional single stage gain amplifier in a sampling and readout circuitry.

FIG. 2 shows an APS sample and readout circuitry including a single stage gain amplifier 200. The gain amplifier 200 operates as a charge amplifier with an op-amp 202 and two capacitors 204, 206 in a switched capacitor configuration.

The charge amplifier 200 outputs a voltage proportional to the charge coming from the pixel unit according to the relation $$V_{Out} = (I*T_{int})/C_f = -(C_v/C_f)*V_{in},$$

where $T_{int}$ is the charge integration time, $C_f$ is the integration capacitance of the feedback capacitor 206, and I is the current representing the charge coming from the pixel unit. The output voltage 210 of the charge amplifier 200 also can be expressed as a ratio of the values of an input capacitor 204 and a feedback capacitor 206 multiplied by an input voltage 208. Therefore, the gain of the charge amplifier 200 is proportional to the ratio of the two capacitors 204, 206.

The current pixel value present on each column pixel is sampled by a sampling switch 212 and placed onto a holding capacitor 214. The activation of the sampling switch 212 allows the current coming from the pixel unit to initiate the charge amplification by activating a source-follower transistor 216. The transistors 218, 220 are NMOS and PMOS load transistors, respectively.

Initially, the charge amplifier 200 is placed in a voltage following mode with a reset switch 222 closed. This keeps the charge amplifier 200 in a unity gain mode with a high input resistance and a low output resistance. The charge amplification is initiated by opening the reset switch 222. A signal to initiate the amplification operation is generated by the timing and control circuit. The output voltage 210 has a gain based on the ratio between the two capacitors 204, 206.

Figure 3:
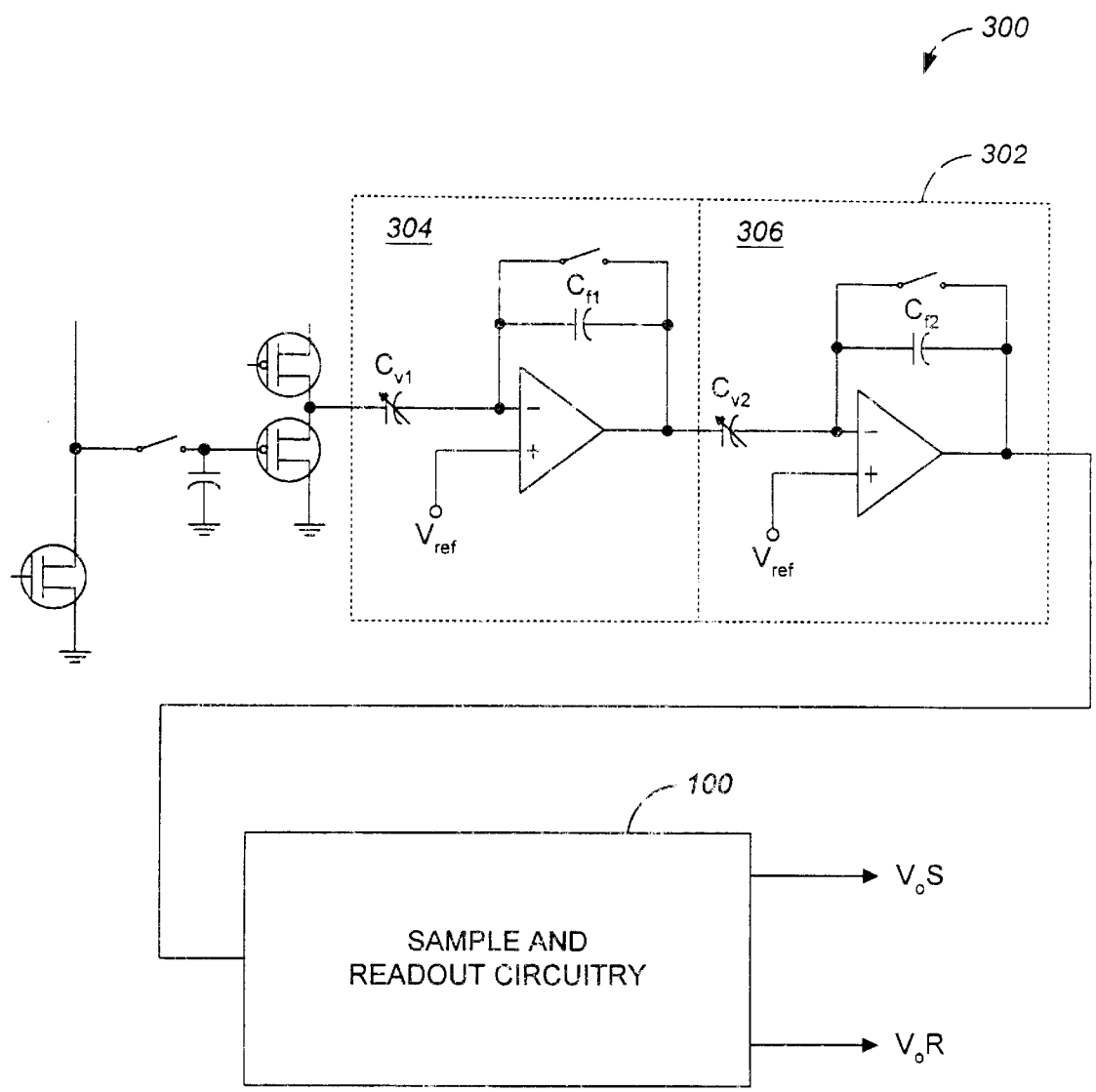
FIG. 3 is one embodiment of a sample and readout circuitry that includes a cascaded-stage amplifier.

FIG. 3 shows one embodiment of a sample and readout circuitry 300 that includes a cascaded-stage charge amplifier 302. The charge amplifier 302 is cascaded into two stages 304, 306.

The first stage 304, which is in an identical configuration as the single stage charge amplifier 200, amplifies the input voltage with a gain of $G_1 = -(C_{v1}/C_{f1})$. The second stage 306, again identical to the single stage amplifier 200, amplifies the output voltage of the first stage 304 with a gain of $G_2 = -(C_{v2}/C_{f2})$. The total gain, $G = G_1 * G_2$, has a multiplying effect on the resultant output voltage.

Figure 4:
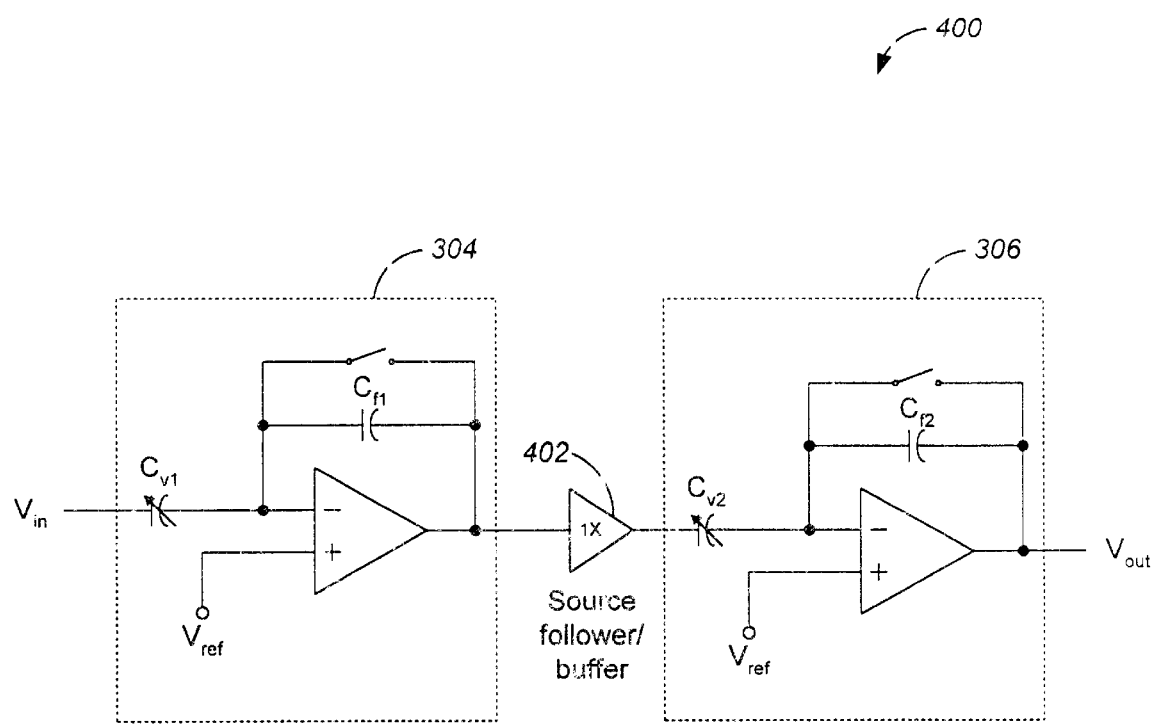
FIG. 4 is a modified cascaded-stage amplifier.

FIG. 4 shows a modified cascaded-stage charge amplifier 400. The modified amplifier 400 includes the two stages 304, 306 shown in FIG. 3. However, the two stages 304, 306 are separated by a source-follower/buffer 402 to reduce the load capacitance of the first stage 304. An important characteristic of the source-follower/buffer 402 is its ability to isolate a high-resistance source from a low-resistance load. To provide this isolation, the buffer has a very high input resistance and a very low output resistance.

The cascaded-stage charge amplifier 302 or 400 has several advantages over the single stage charge amplifier 200 shown in FIG. 2. One of the advantages includes smaller silicon area occupied by capacitors. Since the size of a capacitor is proportional to its value, the single stage amplifier with a gain of G requires a capacitor ratio size of some value, $A_{total}$. The amplifier with two cascaded gains of $G_1$ and $G_2$ requires a capacitor ratio size of $A_1 + A_2$.

For example, in a configuration requiring a gain of 256, the capacitor size ($A_{total}$) for a single stage would be 256 units versus 32 units ($A_1 + A_2$) for two stages of 16X gains. Therefore, the two stages of the cascaded-stage 16X gain amplifier require only 12.5% of the area required for the single stage 256X gain amplifier.

Another advantage includes simplicity of frequency response design in a high speed readout. For example, to increase the gain of a high speed amplifier by a factor of four, such as from 16 to 64, the gain bandwidth of an op-amp would have to be increased proportionately. This is necessary to maintain the frequency of signal response. However, a high gain op-amp requires a very high performance design which can be complex. On the other hand, increasing the gain for a low gain two-stage amplifier while maintaining the frequency response is a simpler task. The gain of each stage can be increased two-fold to eight without substantial degradation in the frequency response because the amplifier gain is sufficiently low.

Figure 5A:
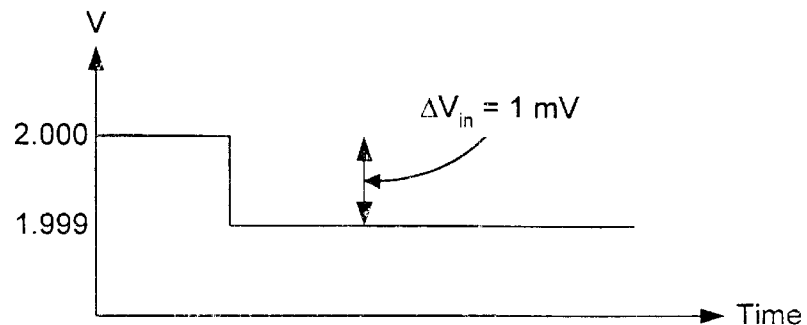
FIG. 5A is a plot of the input difference voltage in a charge amplifier.
Figure 5B:
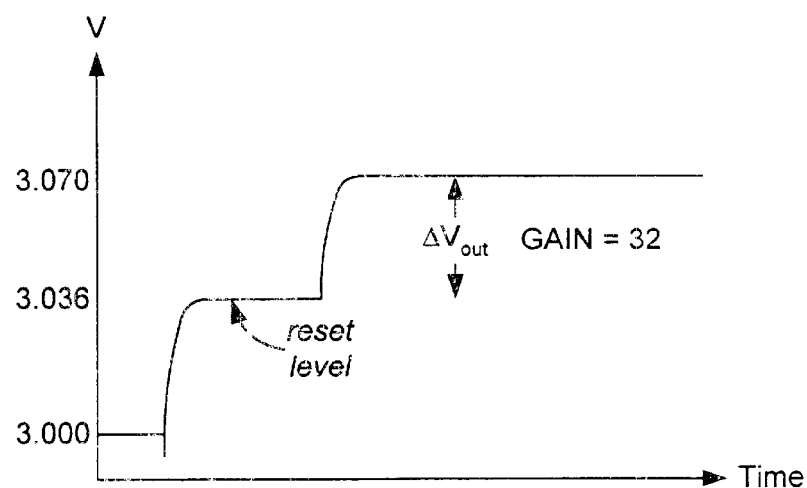
FIG. 5B is a plot of the output difference voltage at the output of the first stage.
Figure 5C:
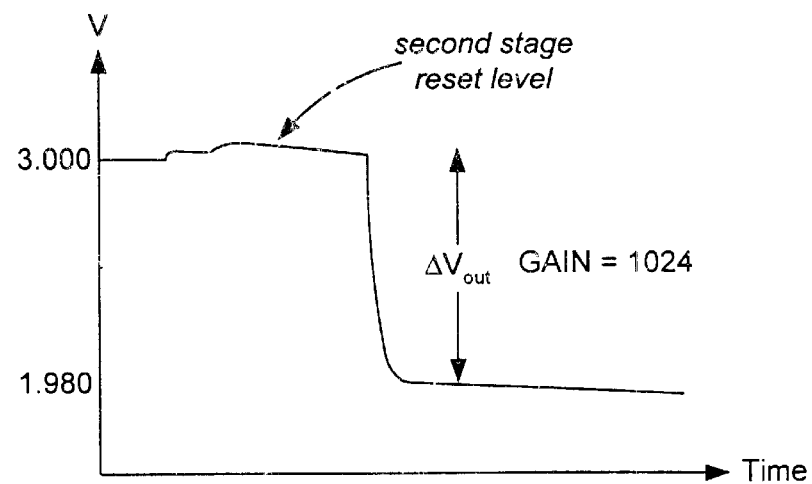
FIG. 5C is a plot of the output difference voltage at the output of the second stage.

FIGS. 5A through 5C illustrate the performance of the cascaded-stage charge amplifier.

A plot of the input difference voltage at the input of the charge amplifier is shown in FIG. 5A. The sampled difference voltage is approximately one millivolt.

A plot of the output difference voltage at the output of the first stage is shown in FIG. 5B. The difference voltage is calculated to be approximately 34 millivolts for a gain of about 32.

A plot of the output difference voltage at the output of the second stage is shown in FIG. 5C. The difference voltage is calculated to be approximately 1.02 volts for a gain of about 1024.

Figure 6:
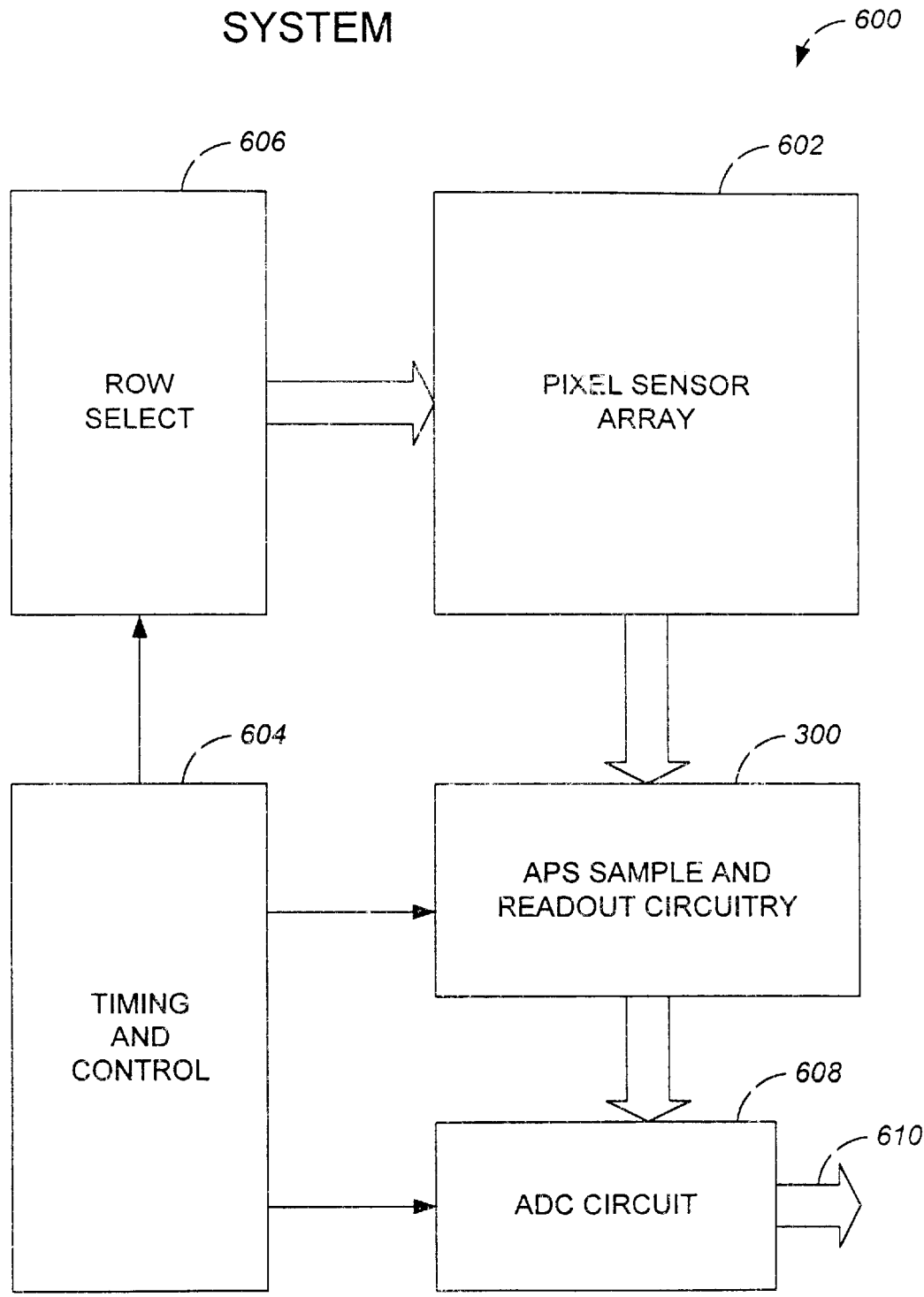
FIG. 6 is an APS system using the cascaded-stage charge amplifier.

FIG. 6 shows an APS system using the cascaded-stage charge amplifier 302 or 400. The APS system 600 includes a pixel sensor array 602, a timing and control unit 604, a row-select element 606, the sample and readout circuitry 300 including the cascaded-stage charge amplifier 302 or 400, and an array of analog-to-digital converter (ADC) circuit 608.

The timing and control unit 604 commands the row-select element 606 to select a row of the pixel sensor array 602 to read out to the output port 610. The sampling and readout circuitry 300 converts the pixel-sensed charge to an analog difference voltage. The analog voltage is amplified by the cascaded-stage charge amplifier 302 or 400 in the sample and readout circuitry 300. A converter in the ADC circuit 608 converts the analog voltage to digital data and stores that data in a register array. The digital pixel data are then channeled to the output port 610.

Figure 7:
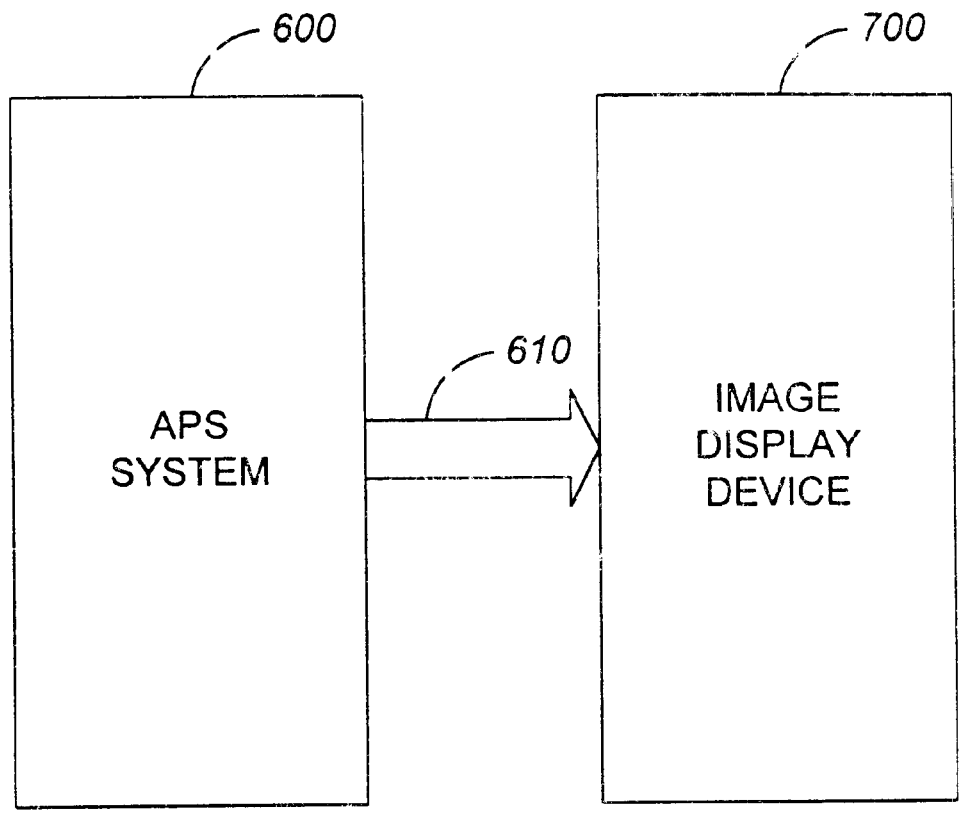
FIG. 7 is an APS camera system that includes the APS system.

FIG. 7 shows an APS camera system that includes the APS system 600 described above. The camera system also includes an image display device 700. The image display device 700 displays the digital pixel data transported to the output port 610 from the APS system 600 for viewing.

Although only a few embodiments have been described in detail above, those of ordinary skill in the art certainly understand that modifications are possible. For example, even though the invention has been described in terms of an APS system, the invention is useful in other pixel based imaging systems. Also, while the preferred aspect shows two cascaded stages, the actual implementation can have more stages. In addition, even though this system is described as being used for reading a row of columns at a time, it should be understood that it can be used for reading a column of rows instead. All such modifications are intended to be encompassed within the following claims, in which.

What is claimed is:

1. A method for reading out data from pixel sensor array, comprising:

sequentially sampling pixel sensor data from an array of pixel sensors, said pixel sensor data representing photons integrated as charge and collected by said pixel sensors;

first amplifying the pixel sensor data in a first gain stage of a charge amplifier;

second amplifying the pixel sensor data in a second gain stage of the charge amplifier;

sequentially outputting analog voltage corresponding to output of said first and second amplifying; and providing a buffer having an input and an output between said first and second amplifying, said buffer operating to isolate high-resistance preceding gain of said first amplifying from the low-resistance succeeding gain of said second amplifying.

2. The method of claim 1, wherein each of said first and second amplifying includes:

amplifying a voltage present at a negative input of an op-amp with respect to some reference voltage at a positive input, said amplifying including connecting a feedback capacitor between an output and the negative input of the op-amp, and providing an input capacitor at the negative input of the op-amp, such that a gain of the op-amp is determined by a ratio of the value of the feedback capacitor and the input capacitor.

3. The method of claim 2, further comprising:

connecting a reset switch between the output and the negative input of the op-amp, where the reset switch is configured to remain closed until a signal to initiate amplification operation opens the reset switch.

4. A method for reading out data from pixel sensor array, comprising:

sequentially sampling pixel sensor data from an array of pixel sensors, said pixel sensor data representing photons integrated as charge and collected by said pixel sensors;

first amplifying the pixel sensor data in a first gain stage of a charge amplifier;

second amplifying the pixel sensor data in a second gain stage of the charge amplifier;

sequentially outputting analog voltage corresponding to output of said first and second amplifying; and providing a source-follower buffer having an input and an output between said first and second amplifying, said buffer operating to isolate high-resistance preceding gain of said first amplifying from the low-resistance succeeding gain of said second amplifying.

* * * * *